US 9,294,035 B2

(12) United States Patent
Manipatruni et al.

(10) Patent No.: US 9,294,035 B2
(45) Date of Patent: Mar. 22, 2016

(54) MULTIGATE RESONANT CHANNEL TRANSISTOR

(71) Applicant: Intel Corporation, Santa Clara, CA (US)

(72) Inventors: Sasikanth Manipatruni, Hillsboro, OR (US); Raseong Kim, Hillsboro, OR (US); Rajashree Baskaran, Seattle, WA (US); Rajeev K. Dokania, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 13/994,714

(22) PCT Filed: Mar. 28, 2013

(86) PCT No.: PCT/US2013/034509
§ 371 (c)(1),
(2) Date: Jun. 15, 2013

(87) PCT Pub. No.: WO2014/158180
PCT Pub. Date: Oct. 2, 2014

(65) Prior Publication Data
US 2014/0292429 A1   Oct. 2, 2014

(51) Int. Cl.
*H03B 5/12* (2006.01)
*H03B 5/30* (2006.01)
(Continued)

(52) U.S. Cl.
CPC ............ *H03B 5/30* (2013.01); *H01L 29/66795* (2013.01); *H01L 29/7831* (2013.01); *H01L 2924/13067* (2013.01); *H01L 2924/13084* (2013.01)

(58) Field of Classification Search
CPC ................. H01L 2924/13084; H01L 29/7831; H01L 29/66795; H01L 2924/13067; H03B 5/30
USPC ...... 331/108 C, 108 R, 110, 52, 56; 257/254; 438/50
See application file for complete search history.

(56) References Cited

U.S. PATENT DOCUMENTS

| 8,502,279 B2 * | 8/2013 | Toh et al. ................... 257/254 |
| 2010/0171569 A1 | 7/2010 | Ionescu et al. |

(Continued)

FOREIGN PATENT DOCUMENTS

WO   WO2011067165   6/2011

OTHER PUBLICATIONS

International Search Report and Written Opinion for Application No. PCT/US2013/034509 mailed Dec. 11, 2013.

(Continued)

*Primary Examiner* — Richard Tan
(74) *Attorney, Agent, or Firm* — Trop, Pruner & Hu, P.C.

(57) ABSTRACT

An embodiment includes an oscillator comprising an amplifier formed on a substrate; a multiple gate resonant channel array, formed on the substrate, including: (a) transistors including fins, each of the fins having a channel between source and drain nodes, coupled to common source and drain contacts; and (b) common first and second tri-gates coupled to each of the fins and located between the source and drain contacts; wherein the fins mechanically resonate at a first frequency when one of the first and second tri-gates is periodically activated to produce periodic downward forces on the fins. Other embodiments include a non planar transistor with a channel between the source and drain nodes and a tri-gate on the fin; wherein the fin mechanically resonates when the first tri-gate is periodically activated to produce periodic downward forces on the fin. Other embodiments are described herein.

25 Claims, 9 Drawing Sheets

(51) Int. Cl.
*H01L 29/66* (2006.01)
*H01L 29/78* (2006.01)

(56) References Cited

U.S. PATENT DOCUMENTS

| | | | |
|---|---|---|---|
| 2010/0276756 | A1 | 11/2010 | Rachmady et al. |
| 2012/0061777 | A1 | 3/2012 | Kolb et al. |
| 2012/0292707 | A1 | 11/2012 | Toh et al. |
| 2014/0048867 | A1* | 2/2014 | Toh et al. ............ 257/324 |

OTHER PUBLICATIONS

Sebastian T. Bartsch, et al., "Nanomechanical Silicon Resonators with Intrinsic Tunable Gain and Sub-nW Power Consumption", ACS Nano, vol. 6, No. 1, Nanoelectronic Devices Laboratory, Switzerland, Dec. 11, 2011, pp. 256-254.
Weinstein, Dana, "The Resonant Body Transistor", American Chemical Society, 2010, pp. 1234-1237, NanoLetters, Ithaca, NY.
Balestra, Francis, "SOI- a platform for transition from micro to nano," in Semiconductor Conference, 2009. CAS 2009. 1nternational, vol. 1, No., pp. 3-12, Oct. 12-14, 2009. Figs. 1, 11, 12, 15, 17; paragraphs 1.1NTRODUCTION.
Irisawa, T.,et al., "High electron mobility enhancement on (110) surface due to uniaxial strain and its impact on short channel device performance of Soi FinFETs," in Silicon Nanoelectronics Workshop, 2008. SNW 2008. IEEE, vol., No., pp. 1-2, Jun. 15-16, 2008. Figs 2, 13: Mobility Characteristics.
Agostinelli, M., et al., "Leakage- Delay Tradeoff in FinFET Logic Circuits: A Comparative Analysis With Bulk Technology," in Very Large Scale Integration (VLSI) System, IEEE Transactions on, vol. 18, No. 2, pp. 232-245, Feb. 2010. Fig. 1; Table II; Fig. 6.
Bartsch, S.T., et al., "Very high frequency double-ended tuning fork nano-mechanical Fin-FET resonator," in Solid-State Sensors, Actuators and Microsystems Conference (Transducers), 2011 16th International, vol., No., pp. 938-941, Jun. 5-9, 2011. Full text.
Chiarella, T., et al., "Migrating from planar to FinFET for further CMOS scaling: SOI of Bulk?," in Solid State Device Research Conference, 2009. ESSDERC '09. Proceedings of the European, vol., No., pp. 85-88, Sep. 14-18, 2009. Full text.
Buhler, R. T., et al., "From micro to nano FinFETs: The impact of channel-shape on analog parameters," in Semiconductor Device Research Symposium, 2009. ISDRS '09. International, vol., No., pp. 1-2, Dec. 9-11, 2009. Full text.
Annema, A.J., et al., "A sub-1V bandgap voltage reference in 32nm FinFET technology," in Solid-State Circuits conference- Digest of Technical Papers, 2009. ISSCC 2009. IEEE International, vol., No., pp. 332-333, Feb. 8-12, 2009. Full text.
Taiwan Patent Office, Office Action mailed Nov. 19, 2015 in Taiwanese Patent Application No. 10311090.

* cited by examiner

MULTIGATE RESONANT CHANNEL TRANSISTOR

TECHNICAL FIELD

Embodiments of the invention are in the field of semiconductor devices and, in particular, micro-electro-mechanical systems (MEMS).

BACKGROUND

An oscillator may include an electric circuit that produces a periodically varying output at a controlled frequency. Filters may be implemented in circuits that selectively pass certain elements of a signal while eliminating other elements of the signal. A resonator may include circuitry that exhibits resonant behavior (i.e., naturally oscillates at resonant frequencies with greater amplitude than at other non-resonant frequencies). Oscillators, filters, resonators and the like may use quartz crystal, inductors, and/or capacitors to generate or promote certain signal frequencies.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
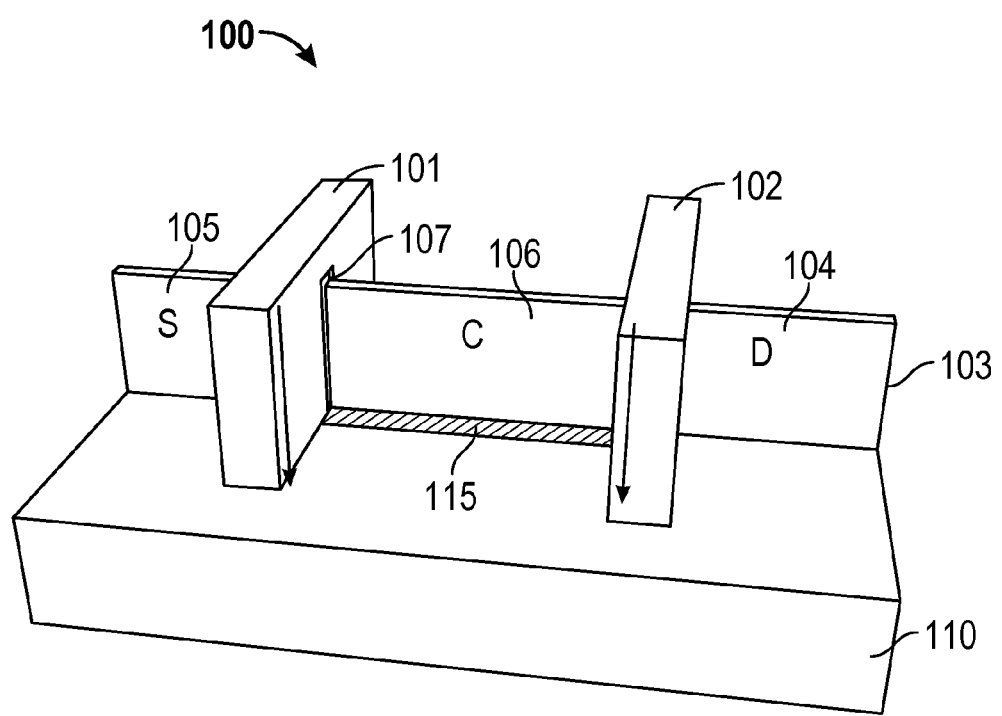
FIG. 1 depicts a multigate resonant transistor in an embodiment of the invention.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

As mentioned above, conventional oscillators, filters, resonators and the like may use quartz crystal, inductors, and/or capacitors to generate or promote certain signal frequencies. Such components can be expensive, unstable, and/or have too large of a footprint (making them less suitable for inclusion on, for example, a "system on a chip" (SoC) that may include logic circuits as well).

An embodiment, however, provides a nonexpensive, stable, and small resonant device suitable for monolithic integration in SoCs that also comprise radiofrequency (RF) and/or wireless components such as oscillators, filters, resonators, switches, and like. The embodiment includes a mechanically resonant fin based field-effect transistor (finFET) formed with two gates. As the gates are activated they place downward force on a bar/fin portion extending between them. The bar may be located on resilient material, which may be included in a trench below the fin. Accordingly, periodically exciting the gates will cause periodic coulombic forces that drive the bar down into the resilient material in a periodic fashion. Thus, periodically exciting the gates forms a resonant device, such as an oscillator. This multigate mechanically resonant transistor is referred to herein as a MGMRT. An embodiment enables MGMRTs using a complementary metal-oxide-semiconductor (CMOS) compatible tri-gate process. Embodiments with compact scalable MGMRTs fabricated in CMOS enable a large range of RF low power mobile and wireless components. The compact oscillators enabled by nano-mechanical resonant devices enable non-Boolean architectures for specialized computing (e.g., pattern recognition applications that rely on resonance).

Thus, embodiments of CMOS based nano-mechanical resonant devices described herein: (1) provide on chip resonant structures (while avoiding or limiting use of inductors and capacitors), (2) enable circuits with a wide frequency operation range (e.g., 1 GHz-100 GHz and spanning several wireless bands), (3) reduce the number of discrete components needed for wireless and RF applications, and/or (4) enable on chip frequency sources for clocking and non-Boolean computing.

Other embodiments are described herein.

FIG. 1 depicts a MGMRT wherein periodically exciting the gates will cause periodic coulombic forces that drive a portion of the fin down into the resilient material in a periodic fashion. Thus, periodically exciting the gates may form a resonant device, such as an oscillator.

In greater detail, FIG. 1 includes an embodiment having two finFETs sharing a common channel section. The section of the channel between the gates acts as a mechanically responsive device reacting to the dielectric force applied from the tri-gate regions. The section of the channel acting as a mechanical resonator is suspended (e.g., suspended over a trench created using a Si—SiGe selective etching process or an oxide removal process).

In even greater detail, FIG. 1 includes a finFET formed around thin strip 103 of semiconductor material (referred to as the "fin"). Fin 103 is formed on layer 110. Layer 110 may be a substrate, oxide, and the like. Fin 103 may be formed from the substrate. The transistor includes FET nodes: gate 101, gate dielectric 107, source region 105, and drain region 104. Source 105 and drain 104 are highly doped (with epitaxial growth in some embodiments). For simplicity the drain and source contacts are not depicted. The conductive channel 106 of the device resides on the outer sides of the fin beneath gate dielectric 107. Specifically, current runs along both "sidewalls" of fin 103 as well as along the top side of fin 103. Because the conductive channel essentially resides along the three different outer, planar regions of fin 103, the particular finFET of FIG. 1 is typically referred to as a "tri-gate" finFET. Other types of finFETs exist (such as "double-gate" finFETs, which are included in other embodiments and in which the conductive channel principally resides only along both sidewalls of fin 103 and not along the top side of fin 103).

The embodiment of FIG. 1 is different from conventional finFETs because, for example, it includes additional gate 102. Conductive channel 106 resides at the interface between fin 103 and gates 101, 102 (or more precisely, the insulation layers between the gates and the fins). However, channel 106 may also be included along the fin between gates 101, 102. Channel 106 may be formed over resilient portion 115. For example, portion 115 may be a trench formed (e.g., via selective etching) beneath fin 103. Trench 115 may be empty (providing a space for which to deflect the fin) or may be filled with resilient material (providing dampening or a trampoline effect for the fin).

While channel 106 may be said to extend between gates 101, 102, this does not pertain to inversion layers. There is no inversion layer (or FET channel in a conventional meaning) in the fin between the gates 101 and 102 because there is no gate present. The mid fin region may be properly doped and function as a simple resistor or conductor (or "channel"), which connects the two inversion layers underneath tri-gates 101 and 102. Thus, FIG. 1 illustrates a series connection of 3 channels (inversion channel under gate 101, doped channel 106 (no gate control), and another inversion channel under gate 102).

The dual gate resonant channel device operates by the mechanical excitation of the suspended channel (i.e., suspended because it extends over trench 115) due to the capacitive force applied by the gates (capacitive considering the metal gates (e.g., first capacitive plate), insulators between the gates and the fins, and the fins (e.g., second capacitive gate)). The oscillation frequency and modes of the channel are decided by the effective spring constant of the bar (which may be based in part on what fin 103 is composed of), the effective mass of the bar, the length of the bar between gates 101 and 102, and boundary conditions for mechanical oscillation (e.g., whether the resonating bar is resonating below both gates or just one gate).

Regarding processing the embodiment of FIG. 1, the device includes a single fin, dual gate resonant channel structure where a missing diffusion contact allows for the formation of the resonant channel. In other words, a conventional finFET may include contacts on either side of a tri-gate. However, the embodiment of FIG. 1 has no contact between gates 101, 102, thereby allowing the fin portion between the gates to resonate. An alternative embodiment may be used where epitaxial steps are blocked in the resonant channel region so that the channel was still free (wholly or partially) to resonate. If buildup is allowed over the channel region that buildup may be eventually removed or altered to so that the channel is free (wholly or partially) to resonate.

Figure 2:
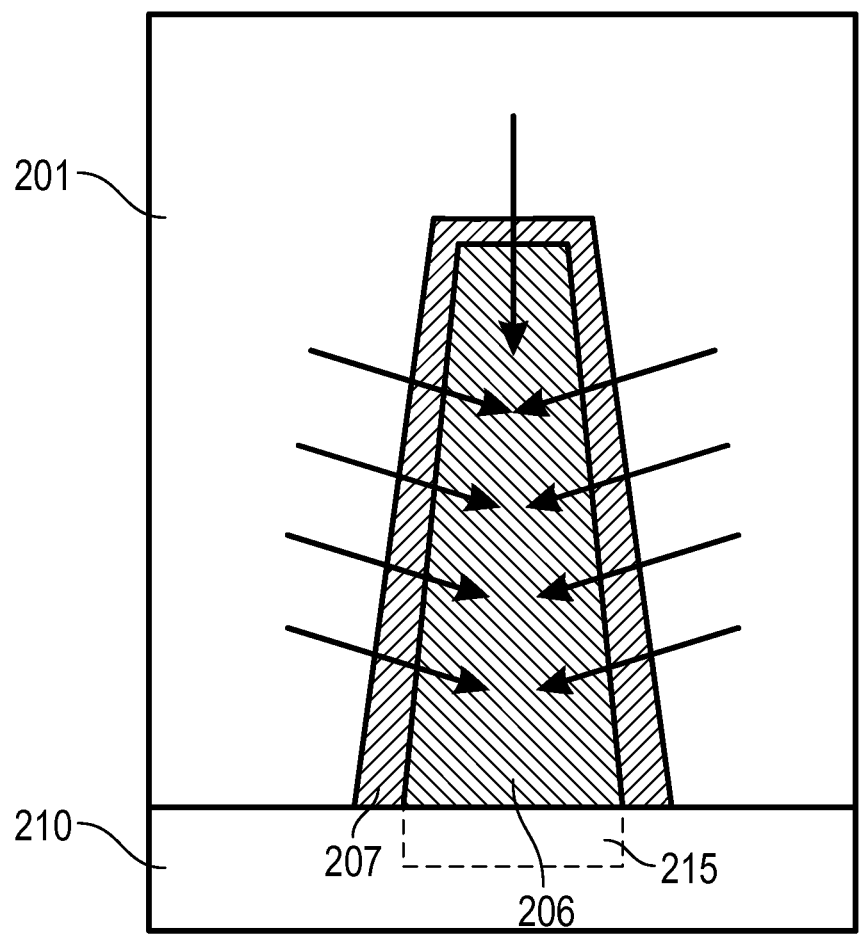
FIG. 2 depicts a fin and gate in a resonant transistor in an embodiment of the invention.

FIG. 2 better illustrates the capacitive/coulombic force (see arrows in FIG. 2). Tri-gate 201 covers insulator 207 and channel portion 206. Channel portion 206 is suspended over trench 215, which is formed in layer 210 (e.g., substrate, oxide). The side walls of the fin are not parallel with each other. Further tri-gate 201 includes a top but no bottom. Thus, tri-gate 201 is configured to generated coulombic forces upon excitation of the gate and those forces will have a net downward vector (see arrows in FIG. 2). This downward force will mechanically drive channel 206 downward into region 215. In other words, FIG. 2 shows a cross section of a gate and asymmetric excitation force leading to a net downward force at the ends of the channel.

In an embodiment, to excite the mechanical modes of the device the gates of the device are biased at a nominal operating direct current (DC) voltage in combination with a small alternating current (AC) signal. The applied time varying voltage (DC+AC) on the gate capacitor produces a time varying force on the channel material, which leads to resonance of the channel section/fin.

Figure 3A:
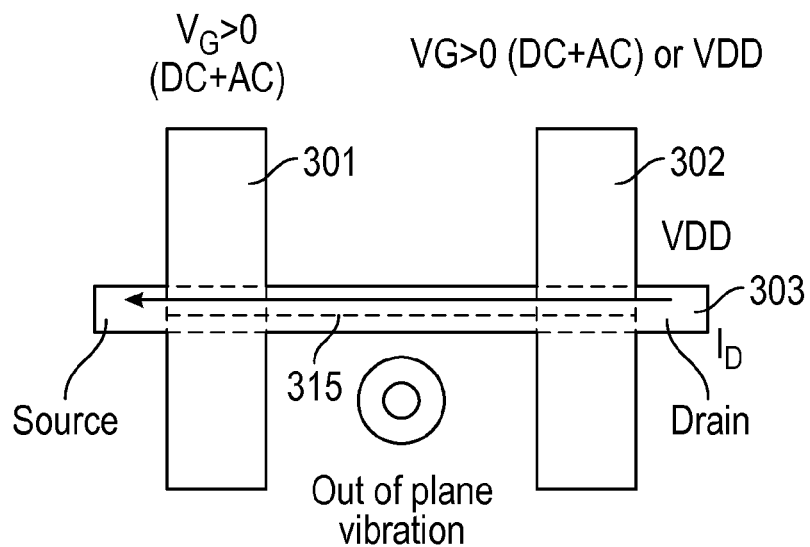
FIGS. 3(a)-(c) depict different boundary conditions for a multigate resonant transistor in an embodiment of the invention.

FIG. 3(a) includes a biasing condition for a MGMRT. Gates 301, 302 are formed over fin 303, which is formed over trench 315. Current $I_D$ flows from a drain region, across a channel region, to a source region. When gate 302 is excited with DC and AC signals, and gate 301 is excited with identical DC and AC signals, the fin is deflected into portion 315 and out of portion 315 to generate out of plane vibration or resonance. The oscillation frequency of the MGMRT spans from 1 GHz to 100s of GHz based on the distance between the gates, control of the fin width, effective mass of the fin, and the like. Embodiments include intragate distances of 10, 50, 100, 500, 750, 1000, and 10000 nm. Other embodiments are not so limited. The fins come in varying widths such as 5, 10, 15, 20 nm or more and heights such as 30, 40, 50 nm or more. The electrical conditions of the gates can be used to change the boundary conditions of the channel beam/bar.

Figure 3B:
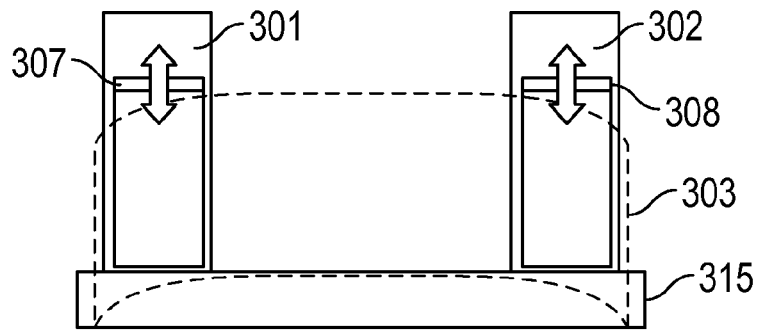

FIG. 3(b) includes a "free/free" orientation or boundary condition where the fin is free to deflect beneath each gate. Thus, gate 301 drives coulombic force through insulator 307 to deflect fin 303 downwards into region 315. Gate 302 drives coulombic force through insulator 308 to deflect fin 303 downwards into region 315. Embodiments include, for example, intragate distances of 10 nm with a transverse mode frequency of 215 GHz, 100 nm with a transverse mode frequency of 18.8 GHz, and 1,000 nm with a transverse mode frequency of 378 MHz. Other embodiments are not so limited.

Figure 3C:
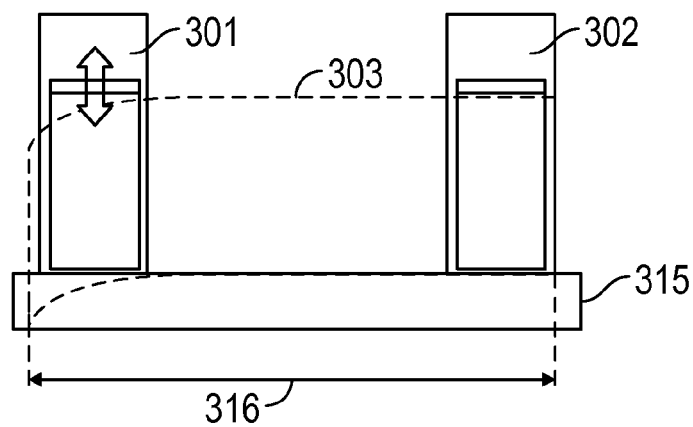

FIG. 3(c) includes a "free/clamped" or "free/fixed" orientation or boundary condition where the fin deflects beneath gate 301 but not gate 302. Thus, gate 301 drives coulombic force through an insulator to deflect fin 303 downwards into region 315. However, gate 302 is not activated and thus does not drive coulombic force through an insulator to deflect fin 303 downwards into region 315. In other embodiments the bar in contact with the gate 302 may not be situated over a trench and consequently is "fixed". Embodiments include, for example, intragate distances of 10 nm with a transverse mode frequency of 105 GHz, 100 nm with a transverse mode frequency of 5.15 GHz, and 1,000 nm with a transverse mode frequency of 60.3 MHz. Other embodiments are not so limited.

Figure 4:
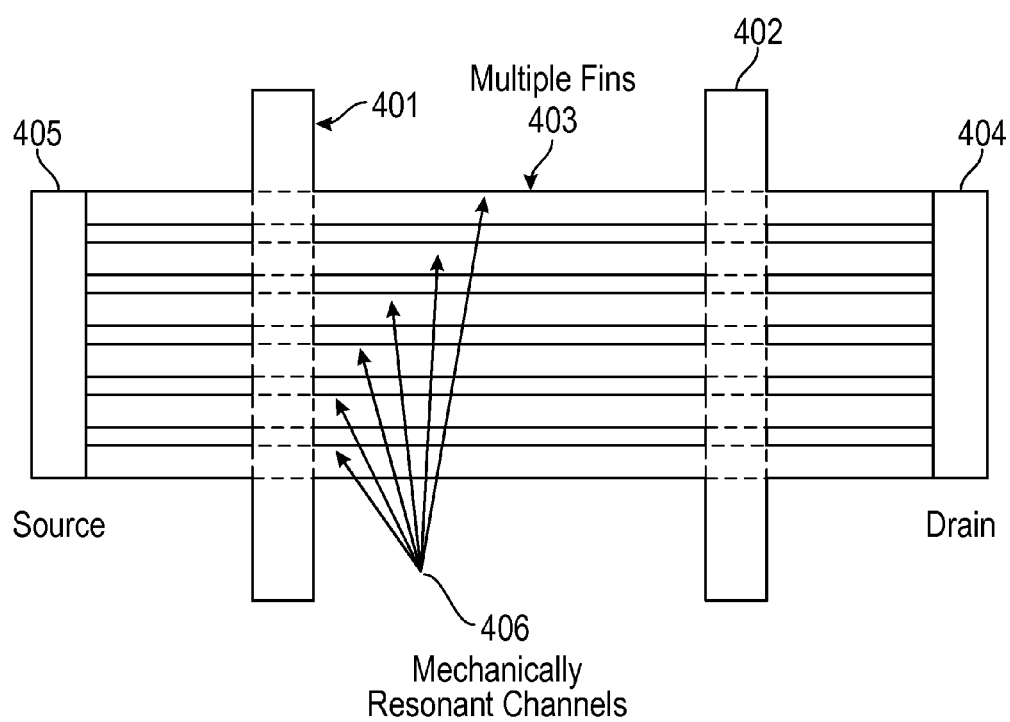
FIG. 4 depicts a multifin resonant array in an embodiment of the invention.

FIG. 4 includes a MGMRT having an array of resonant channel structures for enhanced operating currents. Multiple fins 403 (and multiple channels 406) share source contact 405 and drain contact 404 as well as gates 401, 402. This array allows for higher drive currents and variation tolerance (e.g., one fin resonating slightly out of tolerance is offset by many other fins that do resonate in tolerance).

Figure 5:
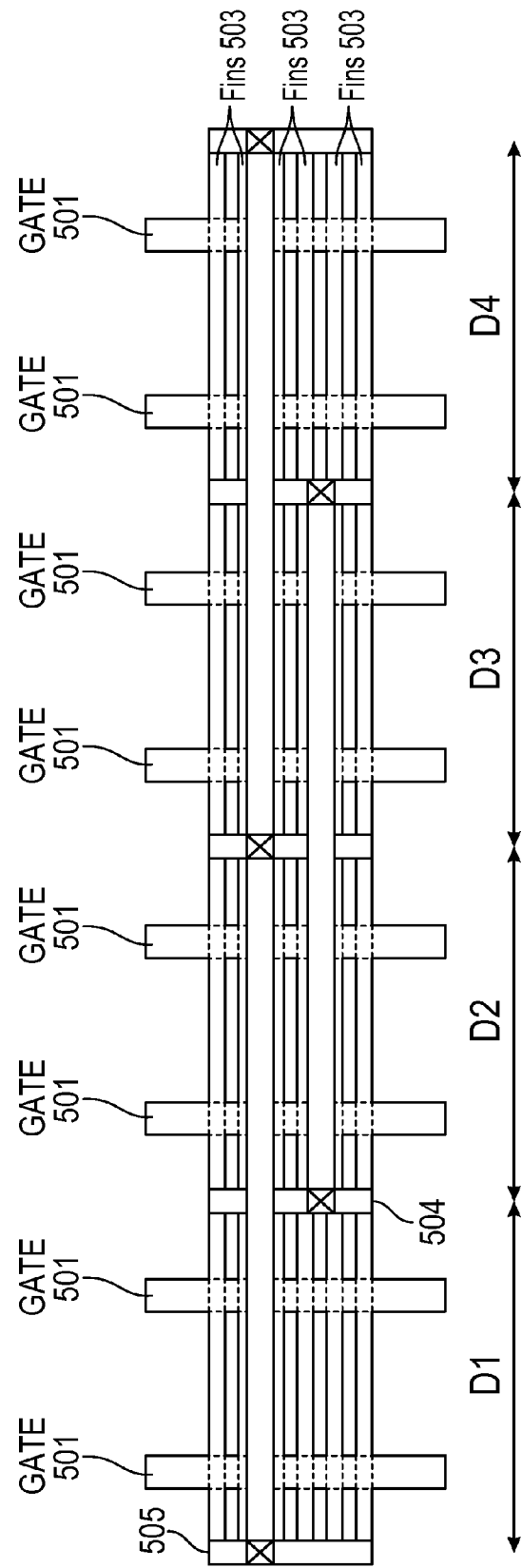
FIG. 5 depicts a multifin resonant array in an embodiment of the invention.

FIG. 5 includes a MGMRT with skipped diffusion contacts that form mechanically resonant channels. More specifically, multiple fins (503) and gates (501) are included among multiple devices (D1, D2, D3, D4). (For example, D1 is a device having 2 gates located between a source and a drain.) The devices all share a common fin region, a common source contact structure 505, and a common drain contact structure 504. This sharing of parts allows for mechanical coupling of resonating members. Thus, FIG. 5 provides an array of coupled mechanical oscillators/resonators that use shared fins for mechanically resonant channels.

Figure 6:
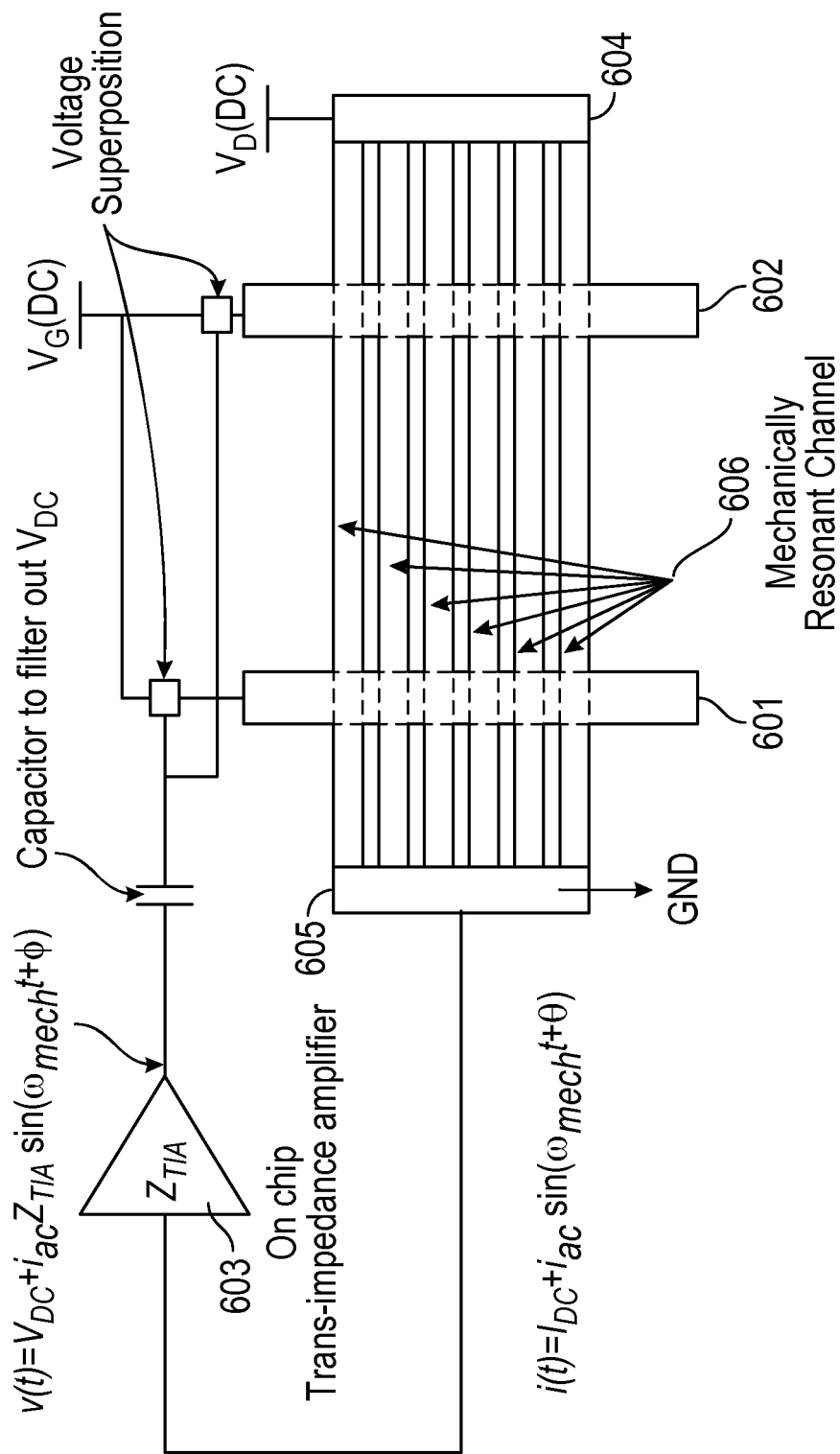
FIG. 6 depicts a multifin resonant array in an oscillator in an embodiment of the invention.

FIG. 6 includes an on chip RF oscillator based on a MGMRT. The oscillator circuit SoC includes a resonant array similar to the embodiment shown in FIG. 4. The array includes channels 606, which share common gates 601, 602, drain contact 604, and source contact 605. Drain contact 604 couples to $V_D$(DC) and source contact 605 couples to ground. Gates 601, 602 are both biased by $V_G$(DC), which is modified by AC output from on chip trans-impedance amplifier 603. Regarding AC output, v(t) is $Z_{TIA}$*i(t), where $Z_{TIA}$ is the trans-impedance amplifier gain, and i(t) is the DC and AC current flowing along the channels. The final voltage applied to the gates (sum of DC and AC inputs) is $V_G + i_{ac} Z_{TIA}$ sin $(\omega_{mech} t + \phi)$, where $i_{ac}$ is the magnitude of the AC component of i(t), $\omega_{mech}$ is the mechanical resonant frequency, and $\phi$ is the phase shift.

Thus, the RF oscillator of FIG. 6 includes a mechanical resonator in a closed loop with an on-chip trans-impedance amplifier. The closed loop couples i(t) from node 605 to amplifier 603. Regarding i(t), $I_{DC}$ is static source-drain current due to $V_G$ and $V_D$ ($V_{DC} \equiv Z_{TIA} * I_{DC}$) and $i_{ac}$ is the magnitude of time-varying current due to vibration/piezoresistive modulation of carrier mobility in the transistor. The frequency of the oscillation is dictated by the mechanical resonance of the suspended channel or bar section between the gates. The oscillation threshold is set by the mechanical transfer gain of the device from the applied gate voltage to the modulated current in the channel of the device. In an embodiment, the frequency of oscillation may be determined by monitoring the change in current magnitude along the fin (where the current magnitude changes as carrier mobility changes due to periodic forces (mechanical stress and strain) applied to the fin by gates).

Figure 7:
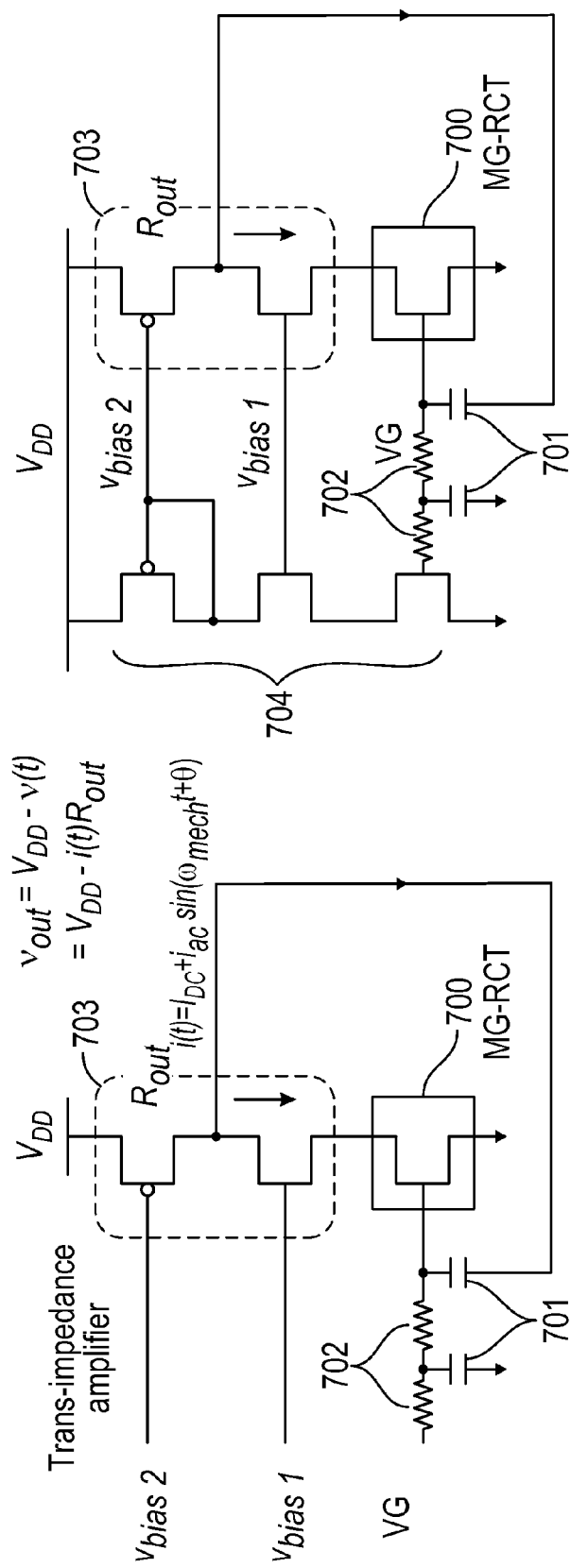
FIGS. 7a and 7b depict multigate resonators in oscillators in an embodiment of the invention.

FIGS. 7(a)-(b) show embodiments of on-chip RF oscillator circuits employing MGMRTs such as the transistors of FIGS. 1, 4, and/or 5. FIG. 7(a) couples MGMRT 700 to trans-impedance amplifier 703, resistors 702, and capacitors 701. The PMOS and NMOS transistors (both ON) constitute the on-chip trans-impedance amplifier where $R_{out}$ is the output resistance of the PMOS and corresponds to $Z_{TIA}$ in FIG. 6. The entire circuit of FIG. 7(a) shares a single monolithic substrate (i.e., SoC).

FIG. 7(b) couples MGMRT 700 to trans-impedance amplifier 703, resistors 702, and capacitors 701. The circuit of FIG. 7(b) shares a single monolithic substrate (i.e., SoC). FIG. 7(a) includes a 3 transistor embodiment with external bias voltages while FIG. 7(b) includes a 6 transistor implementation with an alternative biasing circuit (transistors 704).

Thus, the embodiments of FIGS. 7(a)-(b) provide on-chip oscillators employing MGMRT based oscillators. In an embodiment a piezo-resistively modulated current through the MGMRT is amplified by the circuit and sets up a voltage at the output node of the amplifier, which is then applied to the gate of the MGMRT. A second transistor bridge (transistors 704 of FIG. 7(b)) can be used to setup the biasing conditions for the MGMRT.

Due to the high Q factor provided by mechanical oscillations, the frequency content of the embodiments of FIGS. 7(a) and (b) are stable, have low phase noise, and thereby obviate the need (wholly or partially) for expensive crystal oscillators for RF circuits (e.g., oscillators, resonators, switches, filters) and/or high speed input/output (I/O) systems. Such embodiments are suitable for, as an example, devices requiring inexpensive, highly stable high frequency clock signals that are formed using standard CMOS process. Embodiments, such as those of FIGS. 7(a) and (b) may also be used in, for example, narrowband RF switches or filters at high frequency.

Figure 8:
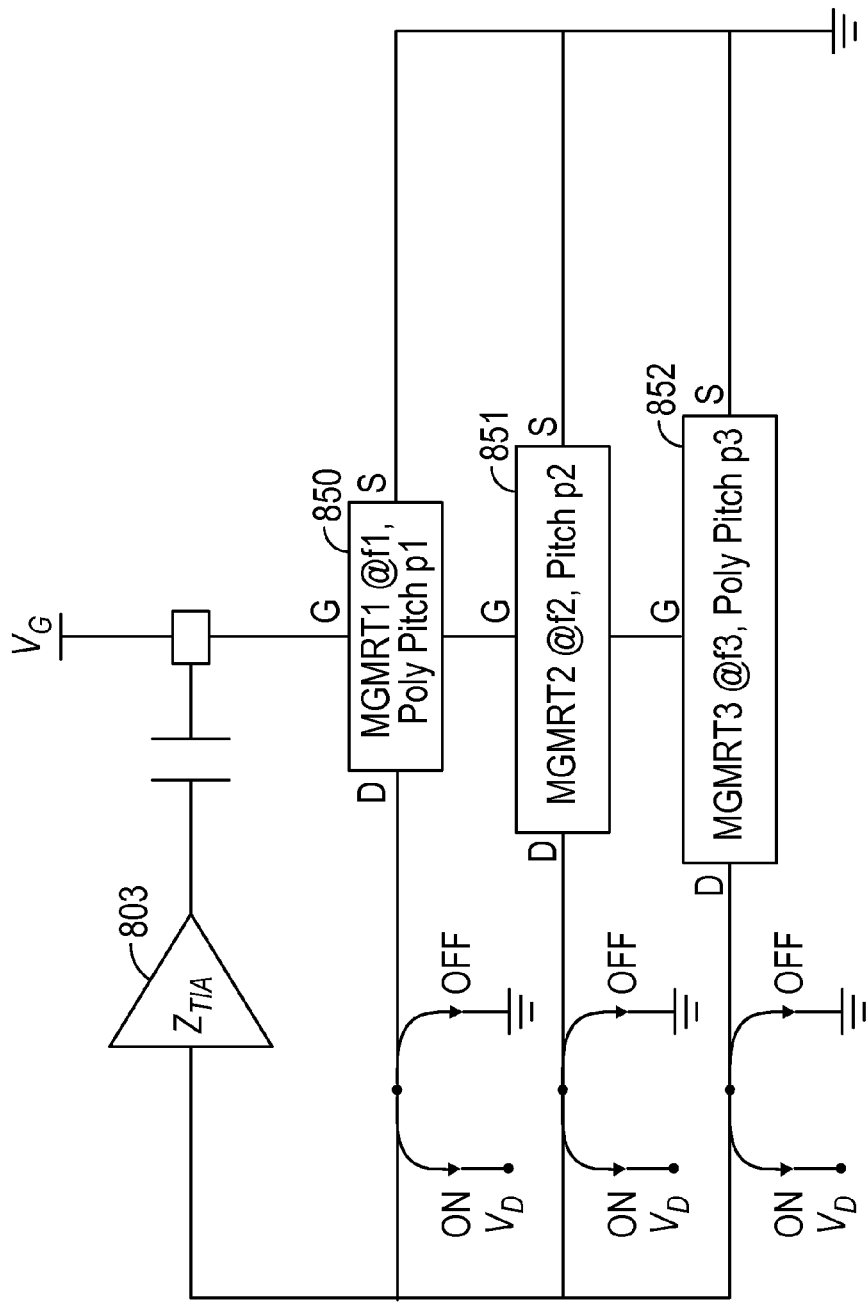
FIG. 8 depicts multigate resonators in a multi-mode oscillator in an embodiment of the invention.

FIG. 8 includes a tunable/multi-mode oscillator with a select/switched resonator feature. Different poly-pitch arrangements (all using the same process technology) produce MGMRTs (850, 851, 852) having different resonant bar lengths (and different resonant frequencies). These MGMRTs may be combined together to create configurable oscillators that oscillate at different frequencies, where the oscillator of a non-desired frequency can be easily switched on or off via any of the switches shown coupled to the drains of MGMRTs 850, 851, 852. By using different combinations of MGMRTs 850, 851, 852, an embodiment provides frequency tuning capabilities. Also, since the voltage scheme directly switches off the acoustic mode sensing from the non-desired structure, the architecture also facilitates the reuse of the same signal path for the amplifier.

While several embodiments addressed herein describe use of a trench, such as portion 115 of FIG. 1, other embodiments are not so limited. For example, the resonating bar (fin located between two force providing gates) may be resilient itself and may have resiliency sufficient to provide resonance without any suspension of the resonating bar. Furthermore, in another embodiment the resonating bar may lie directly or indirectly on a layer that may itself have resiliency sufficient to provide resonance without any (or little) suspension of the resonating bar.

Furthermore, an embodiment provides a method of processing a MGMRT. The method may include disposing a trench layer upon a semiconductor substrate; forming one or more trenches in the trench layer exposing the semiconductor substrate; epitaxially growing a semiconductor material within the one or more trenches to fill the one or more trenches; and removing a portion of the trench layer to expose the semiconductor material as one or more semiconductor fins.

The method may further include forming a gate dielectric layer over at least a portion of the semiconducting fins; forming a first gate electrode over the gate dielectric layer such that it straddles the semiconducting fin; forming a drain region in the semiconducting fin at a side of the first gate electrode; forming a second gate electrode straddling the semiconducting fin over the gate dielectric layer; forming a channel region in the semiconducting fin between the first gate electrode and the second gate electrode; and forming a source region in the semiconducting fin at a side of the second gate electrode such that the two gates are between the source and drain regions.

The method may further include forming a trench beneath the channel portion of the fin. The trench may be formed by selectively etching beneath the fin. In other embodiments the trench may be etched from the underside of the substrate and towards the fin. In other embodiments the trench is formed before the fin is formed. The trench is filled with a temporary material that is later selectively etched after the fin is formed.

The temporarily filled trench may have a wider footprint such that after the fin is formed the footprint of the fin does not completely obscure the footprint of the trench.

At times, such as in FIG. 2, the gate is symmetrically formed about the fin and provides symmetrical sidewall forces. In other words, the coulombic forces applied to the side wall of the fin are symmetric because the gate is disposed symmetrically along the sides of the fin. However, in other embodiments the gate may not be so disposed and may instead be asymmetrically formed on the fin sidewalls and consequently provide asymmetric forces that may cause the fin to resonate in-plane, out-of-plane, or in a hybrid fashion between in-plane and out-of-plane resonance. Furthermore, while the fin sidewalls are not parallel in FIG. 2, in other embodiments the fin sidewalls may be parallel (or more parallel than FIG. 2) and still provide a net downward fin resonance inducing force.

Figure 9:
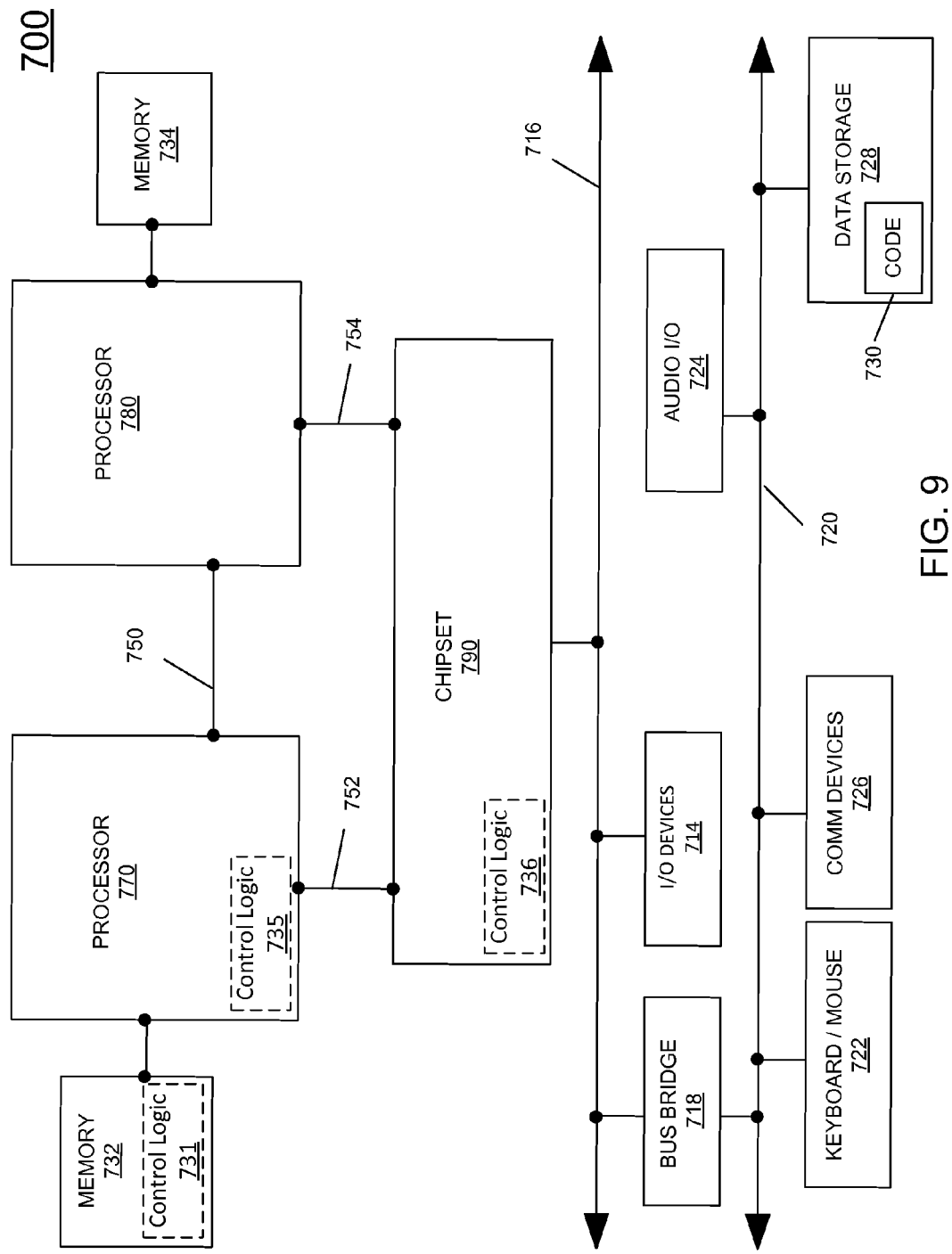
FIG. 9 depicts a system for use with embodiments of the invention.

Embodiments may be used in many different types of systems. For example, in one embodiment a communication device (e.g., cell phone, Smartphone, netbook, notebook, personal computer, watch, and camera) can be arranged to include various embodiments described herein. Referring now to FIG. 9, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors including, for example, embedded non-volatile memory. Each of processors 770 and 780 may include, for example, embedded oscillators such as those described herein. First processor 770 may include a memory controller hub (MCH) and point-to-point (P-P) interfaces. Similarly, second processor 780 may include a MCH and P-P interfaces. The MCHs may couple the processors to respective memories, namely memory 732 and memory 734, which may be portions of main memory (e.g., a dynamic random access memory (DRAM)) locally attached to the respective processors. First processor 770 and second processor 780 may be coupled to a chipset 790 via P-P interconnects, respectively. Chipset 790 may include P-P interfaces and oscillators, filters, switches, and resonators such as those described herein. Furthermore, chipset 790 may be coupled to a first bus 799 via an interface. Various input/output (I/O) devices 714 may be coupled to first bus 799, along with a bus bridge 718, which couples first bus 716 to a second bus 720. Various devices may be coupled to second bus 720 including, for example, a keyboard/mouse 722, communication devices 797, and data storage unit 728 such as a disk drive or other mass storage device, which may include code 730, in one embodiment. Code may be included in one or more memories including memory 728, 732, 734, memory coupled to system 700 via a network, and the like. Further, an audio I/O 724 may be coupled to second bus 720.

The following examples pertain to further embodiments.

Example 1 includes a mechanical resonator comprising: a non planar transistor including a fin that includes source and drain nodes, and a channel between the source and drain nodes; a first nonplanar tri-gate on the fin between the source and drain nodes; and first insulation included between the first tri-gate and the fin; wherein the fin mechanically resonates when the first tri-gate is periodically activated to produce periodic downward forces on the fin.

In Example 2, the subject matter of Example 1 can optionally include a second nonplanar tri-gate on the fin between the source and drain nodes; and second insulation included between the second tri-gate and the fin; wherein at least a portion of the channel extends between the first and second tri-gates.

In Example 3, the subject matter of Examples 1-2 can optionally include wherein the first tri-gate includes a top wall coupling together two sidewalls and the two sidewalls are not parallel to each other.

In Example 4, the subject matter of Examples 1-3 can optionally include wherein the channel is suspended.

In Example 5, the subject matter of Examples 1-4 can optionally include a layer directly contacting the fin, wherein the channel is suspended over a trench formed in the layer.

In Example 6, the subject matter of Examples 1-5 can optionally include wherein the trench is at least partially filled with a resilient material.

In Example 7, the subject matter of Examples 1-6 can optionally include wherein the trench is at least partially empty.

In Example 8, the subject matter of Examples 1-7 can optionally include wherein the trench extends at least from the first tri-gate to the second tri-gate.

In Example 9, the subject matter of Examples 1-8 can optionally include wherein the fin mechanically resonates within the trench when the first and second tri-gates are periodically activated to each produce periodic downward forces on the fin.

In Example 10, the subject matter of Examples 1-9 can optionally include wherein the fin mechanically resonates when the first and second tri-gates are periodically activated to each produce periodic downward forces on the fin.

In Example 11, the subject matter of Examples 1-10 can optionally include a component selected from the group comprising a filter, a resonator, and an oscillator, wherein the component includes the transistor and does not include an inductor.

In Example 12, the subject matter of Examples 1-11 can optionally include wherein the periodic downward forces are dielectric forces.

In Example 13, the subject matter of Examples 1-12 can optionally include wherein the fin mechanically resonates at a frequency dependent on a distance extending from the first tri-gate to the second tri-gate.

In Example 14, the subject matter of Examples 1-13 can optionally include wherein carrier mobility within the channel is based on the frequency.

In Example 15, the subject matter of Examples 1-14 can optionally include wherein the fin mechanically resonates within a trench, formed below the fin, when the first and second tri-gates are periodically activated to each produce periodic downward forces on the fin.

In Example 16, the subject matter of Examples 1-15 can optionally include additional fins coupled to the first and second tri-gates; wherein the fin and the additional fins all synchronously resonate together when the first and second tri-gates are periodically activated to each produce periodic downward forces on the fin and the additional fins.

In Example 17, the subject matter of Examples 1-16 can optionally include an additional source node included in the fin and an additional channel between the additional source node and the drain node; a third nonplanar tri-gate on the fin between the additional source node and the drain node; and a third insulation included between the third tri-gate and the fin; wherein a mechanical resonator includes the source and drain nodes and an additional mechanical resonator, coupled to the mechanical resonator, includes the additional source node and the drain node.

In Example 18, the subject matter of Examples 1-17 can optionally include wherein the transistor is formed on a substrate that lies within a plane and the fin resonates orthogonally to the plane.

Example 19 includes an oscillator comprising: an amplifier formed on a monolithic substrate; a multiple gate resonant channel array, formed on the substrate and coupled to the amplifier, including: (a) a plurality of transistors including a plurality of fins, each of the fins having a channel between source and drain nodes, coupled to common source and drain contacts; and (b) common first and second tri-gates coupled to each of the fins and located between the source and drain contacts; wherein the fins mechanically resonate at a first frequency when one of the first and second tri-gates is periodically activated to produce periodic downward forces on the fins.

In Example 20, the subject matter of Examples 19 can optionally include wherein when the first and second gates couple to a DC source and the amplifier supplies AC to the first and second gates, the fins resonate at a frequency that is based on a distance that extends along the fins from the first gate to the second gate.

In Example 21, the subject matter of Examples 19-20 can optionally include no crystal oscillator or inductor.

In Example 22, the subject matter of Examples 19-21 can optionally include an additional multiple gate resonant channel array, formed on the substrate and coupled to the amplifier, including an additional plurality of fins that mechanically resonate at a second frequency, unequal to the first frequency, when the one of the first and second tri-gates is periodically activated to produce the periodic downward forces on the fins.

Example 23 includes a method comprising: forming a non planar transistor including a fin that includes source and drain nodes, and a channel between the source and drain nodes; and forming first and second tri-gates on the fin between the source and drain nodes; wherein the fin mechanically resonates when the first tri-gate is periodically activated to produce periodic downward forces on the fin.

In Example 24, the subject matter of Examples 23 can optionally include forming the fin on a layer; and forming a trench in the layer and directly below the channel.

In Example 25, the subject matter of Examples 23-24 can optionally include forming a resilient material within the trench.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A mechanical resonator apparatus comprising:
   a nonplanar transistor including a fin that includes source and drain nodes, and a channel between the source and drain nodes;
   an additional source node included in the fin and an additional channel between the additional source node and the drain node;
   a first tri-gate, which is nonplanar, on the fin between the source and drain nodes; and first insulation included between the first tri-gate and the fin;
   a second tri-gate, which is nonplanar, on the fin between the source and drain nodes; and second insulation included between the second tri-gate and the fin;
   a third tri-gate, which is nonplanar, on the fin between the additional source node and the drain node; and a third insulation included between the third tri-gate and the fin;
   wherein at least a portion of the channel extends between the first and second tri-gates;
   wherein the fin mechanically resonates when the first tri-gate is periodically activated to produce periodic downward forces on the fin;
   wherein a mechanical resonator includes the source and drain nodes and an additional mechanical resonator, coupled to the mechanical resonator, includes the additional source node and the drain node.

2. The apparatus of claim 1, wherein the first tri-gate includes a top wall coupling together two sidewalls and the two sidewalls are not parallel to each other.

3. The apparatus of claim 1, wherein the channel is suspended.

4. The apparatus of claim 1 comprising a layer directly contacting the fin, wherein the channel is suspended over a trench formed in the layer.

5. The apparatus of claim 4, wherein the trench is at least partially filled with a resilient material.

6. The apparatus of claim 4, wherein the trench is at least partially empty.

7. The apparatus of claim 4, wherein the trench extends at least from the first tri-gate to the second tri-gate.

8. The apparatus of claim 4, wherein the fin mechanically resonates within the trench when the first and second tri-gates are periodically activated to each produce periodic downward forces on the fin.

9. The apparatus of claim 1, wherein the fin mechanically resonates when the first and second tri-gates are periodically activated to each produce periodic downward forces on the fin.

10. The apparatus of claim 9 further comprising a component selected from the group comprising a filter, a resonator, and an oscillator, wherein the component includes the nonplanar transistor and does not include an inductor.

11. The apparatus of claim 9 wherein the periodic downward forces are dielectric forces and the channel is included along a top and two sidewalls of the fin.

12. The apparatus of claim 9, wherein the fin mechanically resonates at a frequency dependent on a distance extending from the first tri-gate to the second tri-gate.

13. The apparatus of claim 12, wherein carrier mobility within the channel is based on the frequency.

14. The apparatus of claim 1, wherein the fin mechanically resonates within a trench, formed below the fin, when the first and second tri-gates are periodically activated to each produce periodic downward forces on the fin.

15. The apparatus of claim 1 comprising additional fins coupled to the first and second tri-gates; wherein the fin and the additional fins all synchronously resonate together when the first and second tri-gates are periodically activated to each produce periodic downward forces on the fin and the additional fins.

16. The apparatus of claim 1, wherein the nonplanar transistor is formed on a substrate that lies within a plane and the fin resonates orthogonally to the plane.

17. An oscillator comprising:
an amplifier formed on a monolithic substrate;
a multiple gate resonant channel array, formed on the substrate and coupled to the amplifier, including: (a) a plurality of transistors including a plurality of fins, each of the fins having a channel between source and drain nodes, coupled to common source and drain contacts; and (b) common first and second tri-gates coupled to each of the fins and located between the source and drain contacts;
wherein the fins mechanically resonate at a first frequency when one of the first and second tri-gates is periodically activated to produce periodic downward forces on the fins.

18. The oscillator of claim 17, wherein when the first and second tri-gates couple to a DC source and the amplifier supplies AC to the first and second tri-gates, the fins resonate at the first frequency that is based on a distance that extends along the fins from the first tri-gate to the second tri-gate.

19. The oscillator of claim 17 comprising no crystal oscillator or inductor.

20. The oscillator of claim 17 comprising an additional multiple gate resonant channel array, formed on the substrate and coupled to the amplifier, including an additional plurality of fins that mechanically resonate at a second frequency, unequal to the first frequency, when the one of the first and second tri-gates is periodically activated to produce the periodic downward forces on the fins.

21. A method comprising:
forming a fin on a layer;
forming a nonplanar transistor including the fin that includes source and drain nodes, and a channel between the source and drain nodes;
forming a trench in the layer and directly below the channel; and
forming first and second tri-gates on the fin between the source and drain nodes;
wherein the fin mechanically resonates when the first tri-gate is periodically activated to produce periodic downward forces on the fin.

22. The method of claim 21 comprising forming a resilient material within the trench.

23. A mechanical resonator apparatus comprising:
a nonplanar transistor including a fin that includes source and drain nodes, and a channel between the source and drain nodes;
a layer directly contacting the fin and including a trench;
a first tri-gate, which is nonplanar, on the fin between the source and drain nodes; and first insulation included between the first tri-gate and the fin;
a second tri-gate, which is nonplanar, on the fin between the source and drain nodes; and second insulation included between the second tri-gate and the fin;
wherein (a) the channel is suspended over the trench, (b) the fin mechanically resonates when the first tri-gate is periodically activated to produce periodic downward forces on the fin, and (c) at least a portion of the channel extends between the first and second tri-gates.

24. The apparatus of claim 23 comprising a component selected from the group comprising a filter, a resonator, and an oscillator, wherein the component includes the nonplanar transistor and does not include an inductor.

25. The apparatus of claim 23, wherein the trench is at least one of (a) partially filled with a resilient material, and (b) partially empty.

* * * * *